(12) United States Patent
Kim et al.

(10) Patent No.: US 7,935,964 B2
(45) Date of Patent: May 3, 2011

(54) OXIDE SEMICONDUCTORS AND THIN FILM TRANSISTORS COMPRISING THE SAME

(75) Inventors: Chang-jung Kim, Yongin-si (KR); Eun-ha Lee, Seoul (KR); Young-soo Park, Yongin-si (KR); Jae-chul Park, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 12/213,327

(22) Filed: Jun. 18, 2008

(65) Prior Publication Data

US 2008/0315200 A1     Dec. 25, 2008

(30) Foreign Application Priority Data

Jun. 19, 2007  (KR) .................. 10-2007-0060053
Dec. 6, 2007   (KR) .................. 10-2007-0126376

(51) Int. Cl.
    *H01L 29/10*          (2006.01)
(52) U.S. Cl. .................. 257/43; 257/57; 257/E29.043
(58) Field of Classification Search .................. 257/57, 257/43
    See application file for complete search history.

(56) References Cited

U.S. PATENT DOCUMENTS

| | | | |
|---|---|---|---|
| 4,960,718 A | 10/1990 | Aina | |
| 5,337,274 A | 8/1994 | Ohji | |
| 5,656,824 A | 8/1997 | den Boer et al. | |
| 5,854,139 A | 12/1998 | Aratani et al. | |
| 5,972,527 A | 10/1999 | Kaijou et al. | |
| 6,107,734 A | 8/2000 | Tanaka et al. | |
| 6,458,636 B1 | 10/2002 | Yi et al. | |
| 6,552,387 B1 | 4/2003 | Eitan | |
| 6,562,491 B1 | 5/2003 | Jeon | |
| 6,563,174 B2 | 5/2003 | Kawasaki et al. | |
| 6,727,522 B1 | 4/2004 | Kawasaki et al. | |
| 6,727,533 B2 | 4/2004 | Matsuzaki et al. | |
| 6,878,962 B1 | 4/2005 | Kawasaki et al. | |
| 6,929,970 B2 | 8/2005 | Andriessen et al. | |
| 7,061,014 B2 | 6/2006 | Hosono et al. | |
| 7,067,843 B2 | 6/2006 | Carcia et al. | |
| 7,071,122 B2 | 7/2006 | Saenger et al. | |
| 7,145,174 B2 | 12/2006 | Chiang et al. | |
| 7,188,922 B2 | 3/2007 | Kubo | |
| 7,189,992 B2 | 3/2007 | Wager, III et al. | |

(Continued)

FOREIGN PATENT DOCUMENTS

CN      1348192     5/2002

(Continued)

OTHER PUBLICATIONS

International Search Report dated Sep. 25, 2008 for corresponding International Application No. PCT/KR2008/003470.

(Continued)

*Primary Examiner* — Jarrett J Stark
*Assistant Examiner* — Lawrence Tynes, Jr.
(74) *Attorney, Agent, or Firm* — Harness, Dickey & Pierce, P.L.C.

(57) ABSTRACT

Oxide semiconductors and thin film transistors (TFTs) including the same are provided. An oxide semiconductor includes Zn atoms and at least one of Hf and Cr atoms added thereto. A thin film transistor (TFT) includes a channel including an oxide semiconductor including Zn atoms and at least one of Hf and Cr atoms added thereto.

23 Claims, 11 Drawing Sheets

U.S. PATENT DOCUMENTS

| | | | |
|---|---|---|---|
| 7,220,635 B2 | 5/2007 | Brask et al. | |
| 7,411,209 B2 | 8/2008 | Endo et al. | |
| 7,456,468 B2 | 11/2008 | Jeon et al. | |
| 2001/0000756 A1 | 5/2001 | Batra et al. | |
| 2002/0074657 A1 | 6/2002 | Nakayama et al. | |
| 2002/0146624 A1 | 10/2002 | Goto et al. | |
| 2003/0218221 A1 | 11/2003 | Wager, III et al. | |
| 2004/0038446 A1 | 2/2004 | Takeda et al. | |
| 2004/0069990 A1 | 4/2004 | Mahajani et al. | |
| 2004/0127038 A1 | 7/2004 | Carcia et al. | |
| 2004/0155270 A1 | 8/2004 | Hoffman | |
| 2004/0180217 A1 | 9/2004 | Inoue et al. | |
| 2005/0017244 A1 | 1/2005 | Hoffman et al. | |
| 2005/0039670 A1 | 2/2005 | Hosono et al. | |
| 2005/0062134 A1 | 3/2005 | Ho et al. | |
| 2005/0167668 A1 | 8/2005 | Korenari et al. | |
| 2005/0199959 A1 | 9/2005 | Chiang et al. | |
| 2005/0199960 A1 | 9/2005 | Hoffman et al. | |
| 2005/0258474 A1 | 11/2005 | Tanaka et al. | |
| 2005/0275038 A1 | 12/2005 | Shih et al. | |
| 2006/0003485 A1 | 1/2006 | Hoffman et al. | |
| 2006/0038242 A1 | 2/2006 | Hsu et al. | |
| 2006/0068091 A1 | 3/2006 | Denda | |
| 2006/0079034 A1 | 4/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0244107 A1 | 11/2006 | Sugihara et al. | |
| 2006/0284172 A1 | 12/2006 | Ishii | |
| 2006/0286737 A1 | 12/2006 | Levy et al. | |
| 2006/0292777 A1 | 12/2006 | Dunbar | |
| 2007/0023750 A1 | 2/2007 | Chiang et al. | |
| 2007/0072439 A1 | 3/2007 | Akimoto et al. | |
| 2007/0184576 A1* | 8/2007 | Chang et al. | 438/104 |
| 2007/0194379 A1 | 8/2007 | Hosono et al. | |
| 2007/0254399 A1 | 11/2007 | Wang et al. | |
| 2008/0206923 A1 | 8/2008 | Kim et al. | |
| 2008/0315194 A1 | 12/2008 | Kim et al. | |
| 2008/0315200 A1 | 12/2008 | Kim et al. | |

FOREIGN PATENT DOCUMENTS

| | | | |
|---|---|---|---|
| EP | 1 737 044 A1 | | 12/2006 |
| EP | 1737044 A1 | * | 12/2006 |
| JP | 63-265818 | | 11/1988 |
| JP | 10-306367 | | 11/1998 |
| JP | A-2004-356196 | | 12/2004 |
| JP | A-2005-026465 | | 1/2005 |
| JP | 2006-005116 | | 1/2006 |
| KR | 10-2005-0092712 | | 9/2005 |
| KR | 10-2006-0114469 | | 11/2006 |
| WO | WO 2005/088726 | | 9/2005 |
| WO | WO 2007/040194 | | 4/2007 |

OTHER PUBLICATIONS

International Search Report dated Dec. 19, 2008 for International Application No. PCT/KR2008/003471.
Office Action mailed Nov. 16, 2090 for co-pending U.S. Appl. No. 12/213,399.
Chinese Office Action mailed Aug. 23, 2010 and English translation thereof.
Chinese Office Action mailed Aug. 4, 2010 and English translation thereof.
Chinese Office Action mailed Oct. 25, 2010 and English translation thereof.
Office Action dated Nov. 24, 2010 for U.S. Appl. No. 11/978,581.
Office Action dated Dec. 3, 2010 for U.S. Appl. No. 12/071,097.
European Search Report and Written Opinion dated Jun. 16, 2010.
European Search Report and Written Opinion dated Jun. 14, 2010.
Office Action mailed May 11, 2010 for co-pending U.S. Appl. No. 11/978,581.
Office Action mailed Sep. 12, 2008 for co-pending U.S. Appl. No. 11/898,037.
Office Action mailed Jun. 25, 2009 for co-pending U.S. Appl. No. 11/898,037.
Office Action mailed Mar. 6, 2009 for co-pending U.S. Appl. No. 11/898,037.
Office Action mailed Aug. 20, 2009 for co-pending U.S. Appl. No. 11/785,269.
Office Action mailed May 21, 2010 for co-pending U.S. Appl. No. 11/785,269.
International Search Report dated May 21, 2008.
European Search Report dated Aug. 28, 2009.

* cited by examiner

OXIDE SEMICONDUCTORS AND THIN FILM TRANSISTORS COMPRISING THE SAME

PRIORITY STATEMENT

This non-provisional U.S. patent application claims priority under 35 U.S.C. §119 to Korean Patent Application Nos. 10-2007-0060053, filed on Jun. 19, 2007, and 10-2007-0126376, filed on Dec. 6, 2007, in the Korean Intellectual Property Office, the entire contents of which are incorporated by reference.

BACKGROUND

Description of the Related Art

Thin film transistors (TFTs) are utilized in various application fields. For example, TFTs are used as switching and driving devices in display devices and as selective switches of cross-point type memory devices.

While liquid crystal displays (LCDs) have been used as display panels for televisions (TVs), TVs also utilize organic light emitting displays (OLEDs). Currently, TV display technology is being developed according to market demands. These market demands include large-sized TVs or digital information displays (DIDs), reduced costs, high-quality images (e.g., better dynamic image presentation, high definition, high luminosity, good contrast ratio and color reproduction, etc. In order to satisfy these requirements, in addition to fabrication of large-sized substrates (e.g., glass), high-performance TFTs capable of being utilized as switching and driving devices for displays are required.

Conventionally, amorphous silicon TFTs (a-Si TFTs) are used as driving and switching devices for displays. Conventional a-Si TFTs are devices that may be formed relatively uniformly on substrates greater than about 4 $m^2$ at relatively low costs. These a-Si TFTs are widely used as driving and switching devices. However, with recent trends towards larger-sized and higher image quality displays, TFTs must have higher performance. But, conventional a-Si TFTs with mobility of about 0.5 $cm^2$/Vs may have reached their application limits. In this regard, higher-performance TFTs with higher mobility than a-Si TFTs and technologies for fabricating such high-performance TFTs may be needed.

Polycrystalline silicon TFTs (poly-Si TFTs) having better performance than a-Si TFTs have relatively high mobility of several tens to several hundreds of $cm^2$/Vs, and may be applied to displays to provide higher image quality relative to a-Si TFTs. Moreover, the characteristics of poly-Si TFTs may degrade less than those of a-Si TFTs. However, complicated processes are required to manufacture poly-Si TFTs, as compared to a-Si TFTs. As a result, poly-Si TFTs may be more expensive to manufacture than a-Si TFTs. For example, poly-Si TFTs may be suitable for manufacturing displays with relatively high image quality and may be applied to products such as OLEDs, but are less cost-effective than a-Si TFTs, and thus there applications are restricted. In addition, with respect to poly-Si TFTs, due to limits on manufacturing equipment and/or lack of uniformity, conventional poly-Si TFTs cannot be formed on substrates greater than about 1 $m^2$, which makes it difficult to apply poly-Si TFTs to larger-sized TV products.

Oxide semiconductor devices are a representative example of this technology may provide a TFT technology having advantages of a-Si TFTs and poly-Si TFTs.

Conventional oxide semiconductor devices include, for example, ZnO-based TFTs. Conventional ZnO-based materials include, for example, ZnO oxides, Ga—In—Zn oxides, etc. ZnO-based semiconductor devices may be manufactured from an amorphous ZnO-based semiconductor using a relatively low temperature process, thus enabling relatively easy manufacture of ZnO-based semiconductor devices on relatively large-sized substrates. A ZnO-based semiconductor, which is a material with relatively high mobility, has electrical properties similar to polycrystalline silicon. Currently, research on applying an oxide semiconductor material layer with relatively high mobility (e.g., a ZnO-based material layer) to a channel region of a TFT has been conducted. The ZnO-based materials may be ZnO materials, Ga—In—Zn oxide materials, etc.

SUMMARY

Example embodiments relate to oxide semiconductors and thin film transistors (TFTs) including the same. At least some example embodiments provide oxide semiconductors including Zn atoms and Hf or Cr atoms and TFTs including the same. At least one example embodiment provides an oxide semiconductor including a Zn oxide and an additional added material (e.g., Hf, Cr or the like). At least one other example embodiment provides an oxide thin film transistor having a channel region including the above-described oxide semiconductor.

According to at least one example embodiment, an oxide semiconductor may include Zn oxide to which Hf or Cr is added. For example, the oxide semiconductor may include a Zn—In composite oxide to which Hf or Cr is added.

At least one other example embodiment provides an oxide thin film transistor. According to at least this example embodiment, the oxide thin film transistor may include a gate and a channel formed to correspond to the gate. The channel may include an oxide semiconductor including Zn atoms and Hf or Cr atoms. The oxide thin film transistor may further include a gate insulator formed between the gate and the channel, and a source and a drain contacting respective sides of the channel.

At least one other example embodiment provides an oxide thin film transistor. According to at least this example embodiment, the oxide thin film transistor may include a gate and a channel formed to correspond to the gate. The channel may include an oxide semiconductor having an amorphous phase region and a crystalline phase region. The thin film transistor may further include a gate insulator formed between the gate and the channel, and a source and a drain contacting respective sides of the channel.

At least one other example embodiment provides an oxide semiconductor including Zn and at least one of Hf and Cr. The Zn may be a Zn oxide to which the at least one of Hf and Cr is added. Alternatively, the Zn may be a Zn—In composite oxide to which the at least one of Hf and Cr is added.

At least one other example embodiment provides an oxide thin film transistor. According to at least this example embodiment, a gate insulating layer may be arranged on a gate. A channel may be formed on the gate insulating layer. The channel may be formed to correspond to the gate and may include an oxide semiconductor including Zn and at least one of Hf and Cr. A source and drain may contact respective sides of the channel.

At least one other example embodiment provides a method of manufacturing an oxide semiconductor. According to at least this example embodiment, an oxide semiconductor having a structure including an amorphous phase region and a crystalline phase region may be formed. The amorphous and crystalline phase regions may co-exist concurrently in the formed oxide semiconductor.

At least one other example embodiment provides a method of manufacturing an oxide thin film transistor. According to at least this example embodiment, a gate may be formed on a substrate, and a gate insulating layer may be formed on the gate. A channel region may be formed on the insulating layer. The channel region may include an oxide semiconductor having a structure including an amorphous phase region and a crystalline phase region. The amorphous and crystalline phase regions may co-exist concurrently in the formed oxide semiconductor. Source and drain regions may be formed on respective ends of the channel region.

According to at least some example embodiments, the oxide semiconductor may have a structure comprising an amorphous phase region and crystalline phase region. The amorphous and crystalline phase regions may co-exist concurrently or simultaneously. The oxide semiconductor may comprise an amorphous phase region, a mixed region of amorphous and crystalline phases and a crystalline phase region. The amorphous, mixed and crystalline phase regions may co-exist concurrently or simultaneously the thickness of the amorphous phase may be in the range of about 10 nm to about 50 nm, inclusive, for example, in the range of about 20 nm to about 30 nm, inclusive. The oxide semiconductor may have an at % ratio of Hf:In:Zn in the range of about 0.5 to 10:1 to 20:0.5 to 40. In another example, the oxide semiconductor may have an at % ratio of Hf:In:Zn in the range of about 1:9 to 19:4.8 to 14.

According to at least some example embodiments, the oxide semiconductor may further include one selected from the group consisting of or including elements of Groups I, II, III and IV and elements belonging to the lanthanide series.

According to at least some example embodiments, the gate may be formed by depositing a conductive material on the substrate, and patterning the conductive material to form the gate. The insulating layer may be formed by depositing an insulating material on the gate, and patterning the insulating material to form the insulating layer. The insulating layer may be formed of silicon oxide, silicon nitride, an Hf oxide, an aluminum oxide, or a mixture of Hf oxide and aluminum oxide. The channel region may be formed by depositing a channel material on the insulating layer, and patterning the channel material to form the channel region. The channel material may be deposited by depositing one of a Zn oxide and a Zn—In composite oxide material on the insulating layer, and adding at least one of Hf and Cr to the deposited oxide material to form the channel material.

According to at least some example embodiments, when the channel material is deposited using sputtering, one of a Zn oxide or a Zn—In composite oxide target and at least one of a Hf and Cr target may be co-sputtered. Alternatively, a single target including one of Zn oxide or Zn—In composite oxide and at least one of Hf and Cr may be sputtered. The channel material may be deposited using physical vapor deposition, chemical layer deposition, or atomic layer deposition. The formed gate, gate insulating layer, channel region and source and drain regions may be annealed at a given temperature.

BRIEF DESCRIPTION OF THE DRAWINGS

Example embodiments will become more apparent by describing in detail the example embodiments shown in the attached drawings in which.

DETAILED DESCRIPTION OF EXAMPLE EMBODIMENTS

Figure 1:
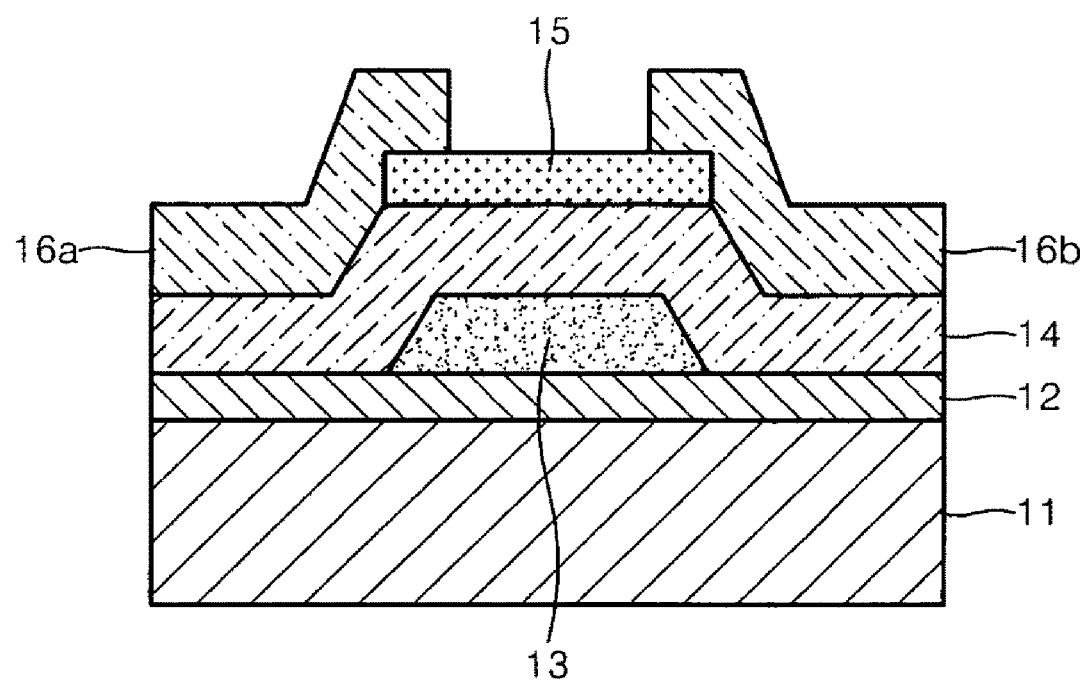
FIG. 1 is a cross-sectional view illustrating an oxide thin film transistor according to an example embodiment.

Various example embodiments will now be described more fully with reference to the accompanying drawings in which some example embodiments are shown. In the drawings, the thicknesses of layers and regions are exaggerated for clarity.

Detailed illustrative example embodiments are disclosed herein. However, specific structural and functional details disclosed herein are merely representative for purposes of describing example embodiments. This invention may, however, may be embodied in many alternate forms and should not be construed as limited to only the example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element or layer is referred to as being "formed on," another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Oxide semiconductors and oxide thin film transistors (TFTs) including the same according to example embodiments will now be described more fully with reference to the example embodiments shown in the accompanying drawings. For reference, the thicknesses and widths of layers shown in the drawings are exaggerated for the purpose of understanding.

An oxide semiconductor according to an example embodiment may include a Zinc (Zn) oxide or Zinc-Indium (Zn—In) composite oxide to which at least one of hafnium (Hf) and chromium (Cr) may be added.

According to at least one example embodiment, Hf having an electronegativity of about 1.3 may form a relatively strong ionic bond with oxygen (O) having electronegativity of about 3.5 because an electronegativity difference between Hf and O is about 2.2. Hf may have an ionic radius of about 0.078 nm which is similar than that of Zn (which may be about 0.074 nm). Thus, when Hf is added to a Zn oxide or Zn—In composite oxide, Zn may be more easily substituted with Hf without deformation of crystal lattice of the oxides. In addition, Cr having electronegativity of about 1.6 may form a relatively strong ionic bond with oxygen having electronegativity of about 3.5 because an electronegativity difference between Cr and O is about 1.9.

With respect to a-Si:H, a covalent bond may be formed between a-Si and hydrogen (H). When a-Si:H is coordinated with sp3 oxygen having directionality to form an amorphous phase, an electron cloud around oxygen bonds may be distorted, thereby forming relatively weak bonds. When TFTs having such a relatively weak bonding structure operate for a relatively long time, electrons or holes may be accumulated at bonding sites, and thus, bonding states may be broken; this may adversely affect reliability due to a threshold voltage shift. On the other hand, with respect to an ionic bond, there may be an overlap of electron orbitals regardless of binding of oxygen anions due to a relatively large electron cloud of cat-ions. Thus, the resultant bonding structure may not have any relatively weak bonds regardless of whether it is a crystal phase or a non-crystal phase; this may result in manufacture of a more reliable TFT. The Zn oxide or Zn—In composite oxide including at least one of Hf and Cr according to at least some example embodiments may be formed mainly of ionic groups, but all of the bindings need not be ionic bonds.

The oxide semiconductor may further include Group I elements such as Li, K, or the like; Group II elements such as Mg, Ca, Sr, or the like; Group III elements such as Ga, Al, In, Y, or the like; Group IV elements such as Ti, Zr, Si, Sn, Ge, or the like; Group V elements such as Ta, Vb, Nb, Sb, or the like; and Ln series elements such as La, Ce, Pr, Nd, Pm, Sm, Eu, Gd, Tb, Dy, Ho, Er, Tm, Yb, Lu, or the like.

Oxide semiconductors according to at least this example embodiment may be employed, for example, as a channel material for driving transistors used in LCDs and OLEDs, as a channel material for selection transistors and//or as a channel material for transistors included in peripheral circuits of memory devices.

FIG. 1 is a cross-sectional view illustrating an oxide thin film transistor (TFT) according to an example embodiment. FIG. 1 illustrates a bottom gate-type TFT, but example embodiments are not limited thereto. Oxide TFTs according to example embodiments may also be top gate-type TFTs.

Referring to FIG. 1, an oxide TFT according to an example embodiment may include an oxide layer 12 formed on a substrate 11. The substrate 11 may be a silicon (Si) substrate. The oxide layer 12 may be formed using a thermal oxidation process, or the like. A gate 13 may be disposed on a portion of a substrate 12, and a gate insulating layer 14 may be disposed on the substrate oxide layer 12 and the gate 13. In one example, the gate 13 may be formed to have a top surface and two sloping side surfaces (e.g., a trapezoid shaped cross-section, wherein the width of the upper surface is less than the width of the lower surface). The gate insulating layer 14 may be formed to cover an upper and side surfaces of the gate 13 and the exposed portion of the upper surface of the oxide layer 12. Although not shown, the oxide layer 12 may be omitted.

Still referring to FIG. 1, a channel 15 may be formed on a portion of the gate insulating layer 14 corresponding to the gate 13. The width of the channel 15 may correspond (e.g., be the same or substantially the same as) the width of the lower surface of the gate 13. A source 16a and a drain 16b may be disposed on respective sides of the channel 15 and on the gate insulating layer 14.

According to at least this example embodiment, the channel 15 may be formed of an oxide semiconductor, such as, a Zn oxide or Zn—In composite oxide to which at least one of Hf and Cr is added.

Materials used to form the above-described layers of the oxide TFT according to at least this example embodiment will now be described.

Still referring to FIG. 1, the substrate 11 may be a substrate commonly used in semiconductor devices. For example, the substrate 11 may be formed of Si, glass, an organic or similar material. The oxide layer 12 disposed on the substrate 11 may be, for example, a $SiO_2$ layer. If the substrate 11 is a Si substrate, the $SiO_2$ layer may be formed by thermally oxidizing the substrate 11. Thus, the oxide layer 12 may be part of the substrate 11. The gate 13 may be formed of a conductive material. The conductive material may be a metal such as Ti, Pt, Ru, Au, Ag, Mo, Al, W, Cu, an alloy thereof or a conductive metal oxide such as IZO(InZnO), AZO (AlZnO), or the like.

The gate insulating layer 14 may be formed of an insulating material commonly used in semiconductor devices. For example, the gate insulating layer 14 may be formed of $SiO_2$, a high-k material having a higher dielectric constant greater than $SiO_2$ (e.g., $HfO_2$, $Al_2O_3$, $Si_3N_4$, a mixture thereof, or the like). Each of the source 16a and the drain 16b may be formed of a conductive material. The conductive material may be a metal such as Ti, Pt, Ru, Au, Ag, Mo, Al, W, Cu, an alloy thereof, or a conductive metal oxide such as IZO (InZnO), AZO (AlZnO), or the like.

A method of manufacturing an oxide TFT according to an example embodiment will be described with reference to FIGS. 2A through 2E. The method shown in FIGS. 2A-2E may be used to manufacture the oxide TFT shown in FIG. 1 and will be described as such for the sake of clarity.

Figure 2A:
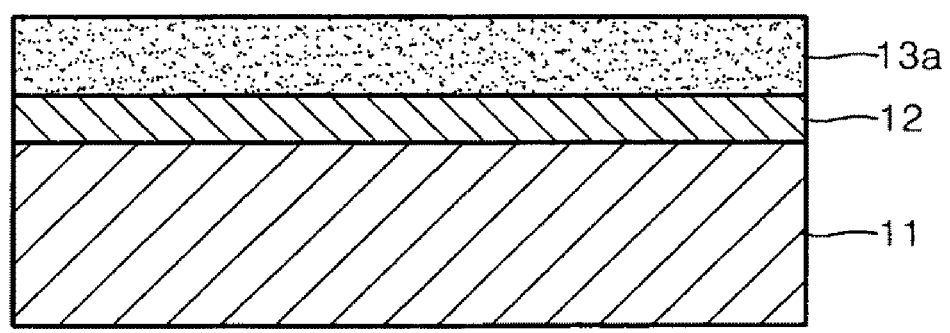
FIGS. 2A to 2E illustrate a method of manufacturing an oxide thin film transistor according to an example embodiment.

Referring to FIG. 2A, a substrate 11 may be prepared. As noted above, the substrate 11 may be formed of Si, glass, an organic or similar material. If the substrate 11 is formed of Si, an oxide layer 12 (e.g., $SiO_2$) may be formed on a surface of the substrate 11 using a thermal oxidation process. A conductive material 13a, such as a metal or conductive metal oxide, may be coated on the substrate 11.

Figure 2B:
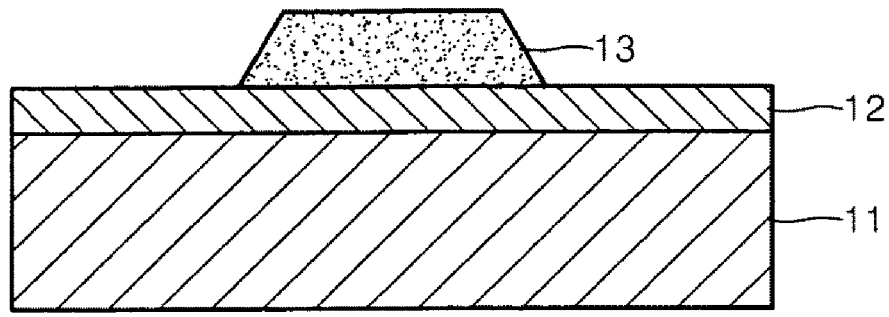

Referring to FIG. 2B, the conductive material 13a may be patterned to form a gate 13.

Figure 2C:
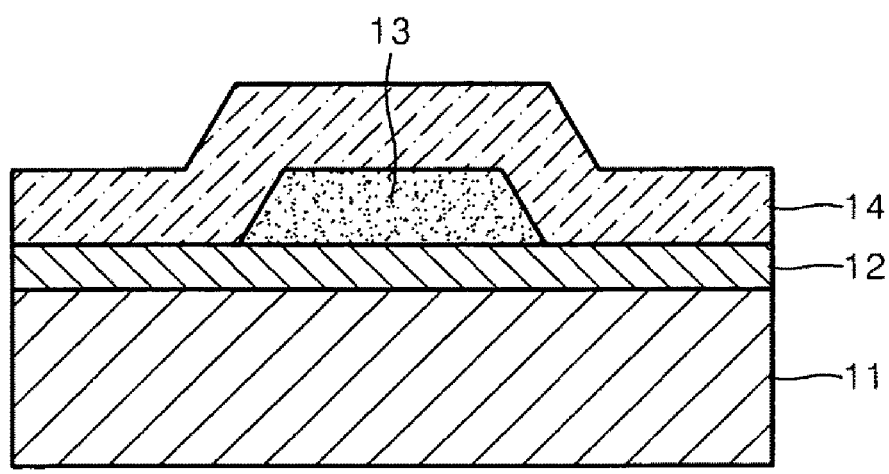

Referring to FIG. 2C, an insulating material may be coated on the gate 13 and patterned to form a gate insulating layer 14. The gate insulating layer 14 may be formed of a silicon oxide, a silicon nitride, a Hf oxide, an aluminum oxide, a mixture of a Hf oxide and an aluminum oxide, or the like.

Figure 2D:
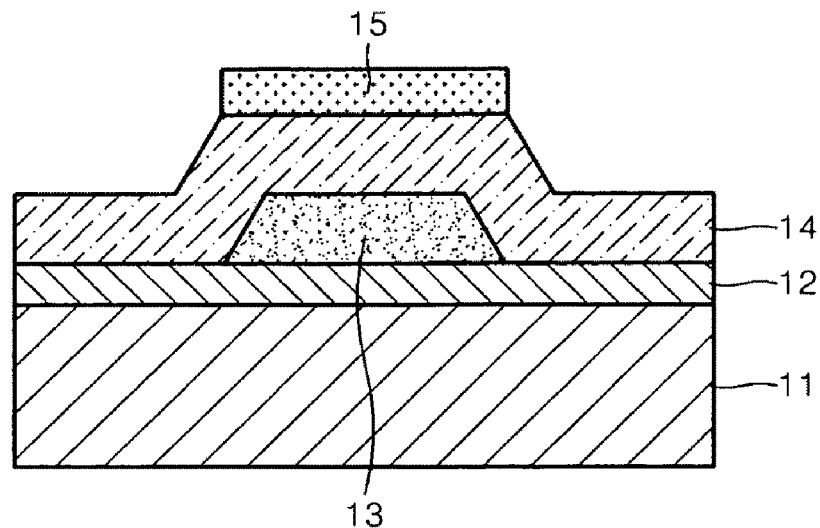

Referring to FIG. 2D, a channel material may be coated on the gate insulating layer 14 using a process such as physical vapor deposition (PVD), chemical vapor depositing (CVD), or atomic layer depositing (ALD). The channel material may be patterned to form a channel 15 on a portion of the gate insulating layer 14 corresponding to the gate 13. The channel 15 may be formed by adding at least one of Hf and Cr to a Zn oxide or Zn—In composite oxide.

In one example, when the channel 15 is formed using sputtering, a ZnO or InZnO target and a Hf or Cr target may be loaded in a process chamber and co-sputtered. Alternatively, a single target including ZnO or InZnO and Hf or Cr may be used.

Figure 2E:
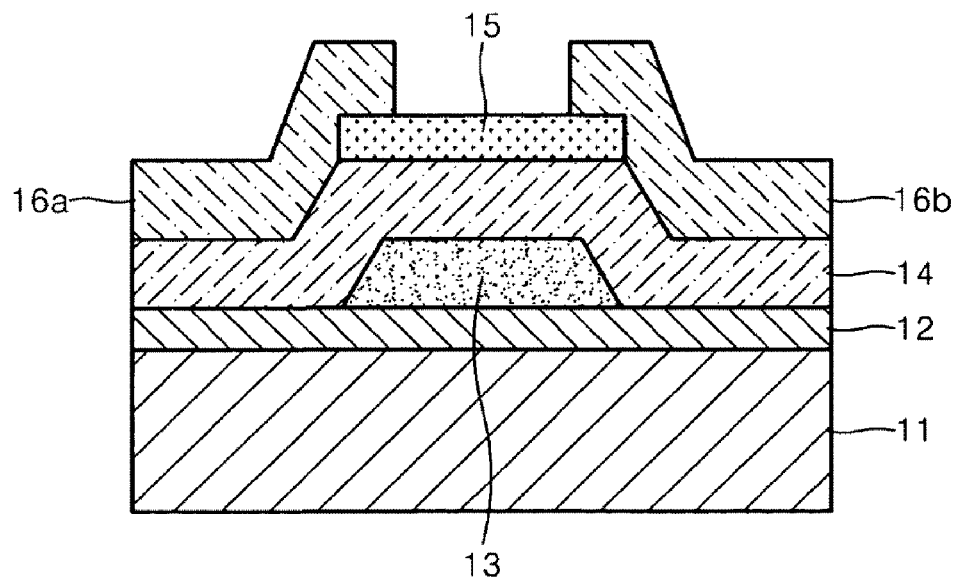

Referring to FIG. 2E, a conductive material such as a metal or conductive metal oxide, may be coated or deposited on the channel 15 and the gate insulating layer 14. The conductive material may be patterned so that the conductive material connects to each end of the channel 15, thereby forming a source 16a and a drain 16b. The resultant structure may be annealed at about 400° C. or less (e.g., at about 300° C.) using a general furnace, rapid thermal annealing (RTA), laser, a hot plate, etc.

Preparation Example

According to at least one example embodiment, silicon oxide may be formed on the surface of a silicon material to form the substrate 11 having a thickness of about 100 nm. Molybdenum (Mo) may be deposited on a portion of the surface of the substrate 11 to form the gate 13 having a thickness of about 200 nm. Silicon nitride may be coated on the substrate 11 and the gate 13 to form a gate insulating layer 14 having a thickness of about 200 nm. An oxide semiconductor may be coated on a portion of the gate insulating layer 14 corresponding to the gate 13 to form the channel 15. A process of forming the channel according to an example embodiment will now be described in more detail.

According to at least this example embodiment, a 99.99% InZnO target (In:Zn=1:1 at %) and a 99.9% Hf target may be used. These targets may be loaded in a chamber of a sputter. The InZnO target and the Hf target may be co-sputtered by applying about 150 watts to the InZnO target and about 20 watts to the Hf target while maintaining the pressure of the chamber at about 5 mTorr. The pressure of the chamber may be maintained by supplying Ar and $O_2$ in a ratio of about 95 sccm:5 sccm, respectively. Thus, a channel may be formed by coating an oxide semiconductor thin film including InZnO and added Hf to a thickness of about 70 nm. In this example, a ZnO target may be used instead of the InZnO target. A Ti/Pt (10/100 nm) double layer may be formed on each side of the channel 15 as a source 16a and a drain 16b. The resultant may be thermally treated at about 150° C. to about 300° C., inclusive, for about 1 hour.

Figure 3:
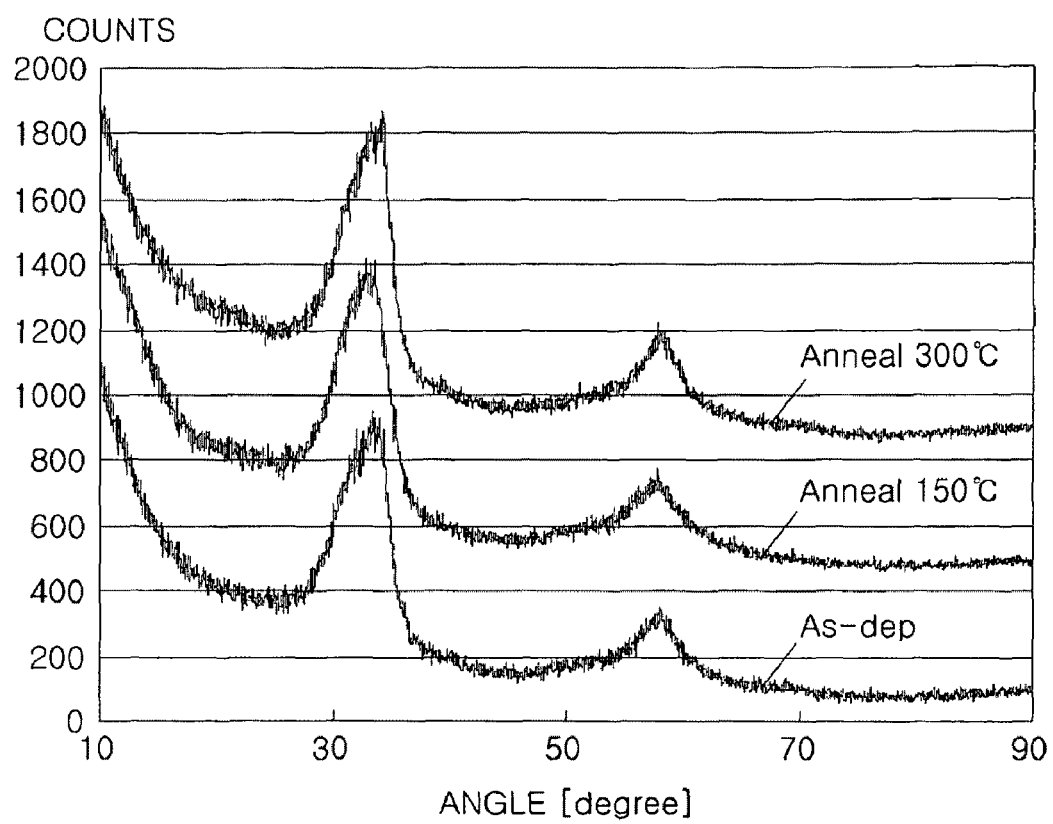
FIG. 3 is a graph illustrating X-ray diffraction (XRD) of samples of InZnO including added Hf according to annealing temperature.

X-ray diffraction (XRD) of the oxide semiconductor prepared according to at least one example embodiment was measured, and the results are shown in FIG. 3. Samples which were not thermally treated (as-dep), and samples thermally treated at about 150° C. and about 300° C. were prepared for the XRD measurement. The XRD was measured at a power of about 40 KeV, at about 40 mA, using a Cu target.

Referring to FIG. 3, peaks are shown at around 30 degrees in samples which were not thermally treated (as-dep) and at about 150° C. and about 300° C. in thermally treated samples. The peaks observed at around 30 degrees are indicative of an amorphous phase of the Zn oxide semiconductor material. Peaks may also be observed at around 60 degrees. These peaks indicate a nano-crystalline phase.

Transmission electron microscope (TEM) images and diffraction patterns of each region of the oxide semiconductor according to example embodiments were measured in order to identify phases of the regions. FIGS. 4A to 4D are TEM images of the samples of InZnO having added Hf.

Figure 4A:
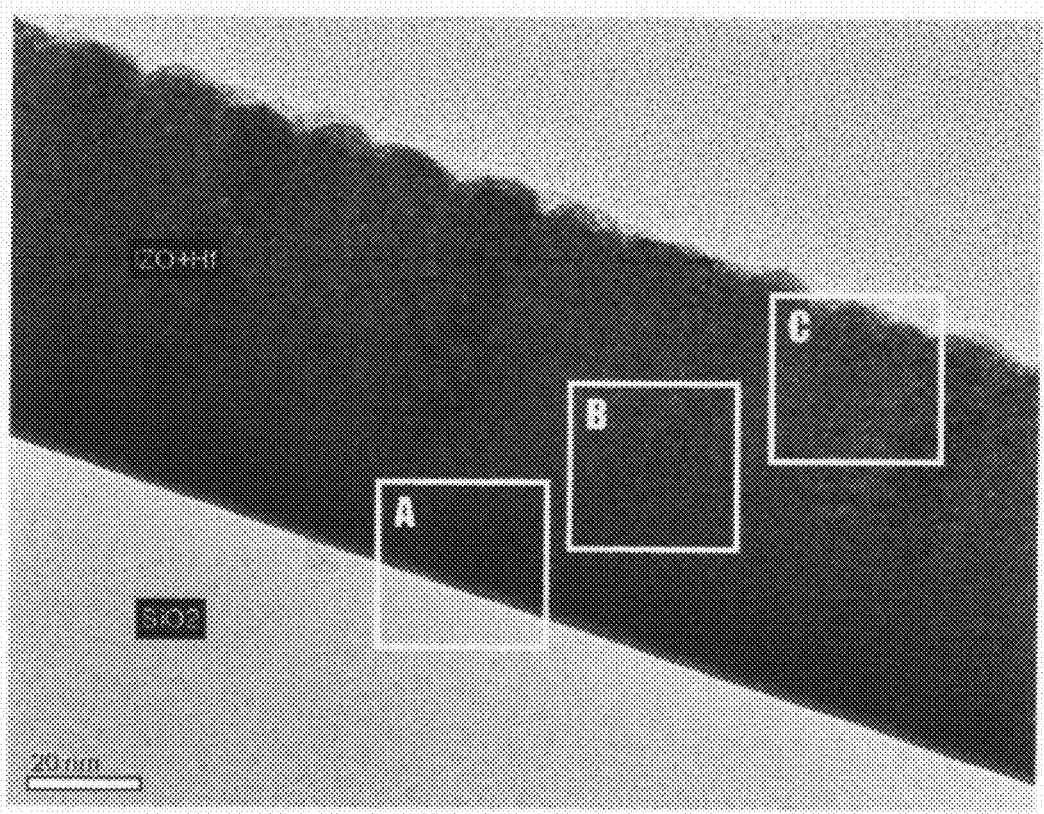
FIGS. 4A to 4D are transmission electron microscope (TEM) images of samples of InZnO including added Hf.
Figure 4B:
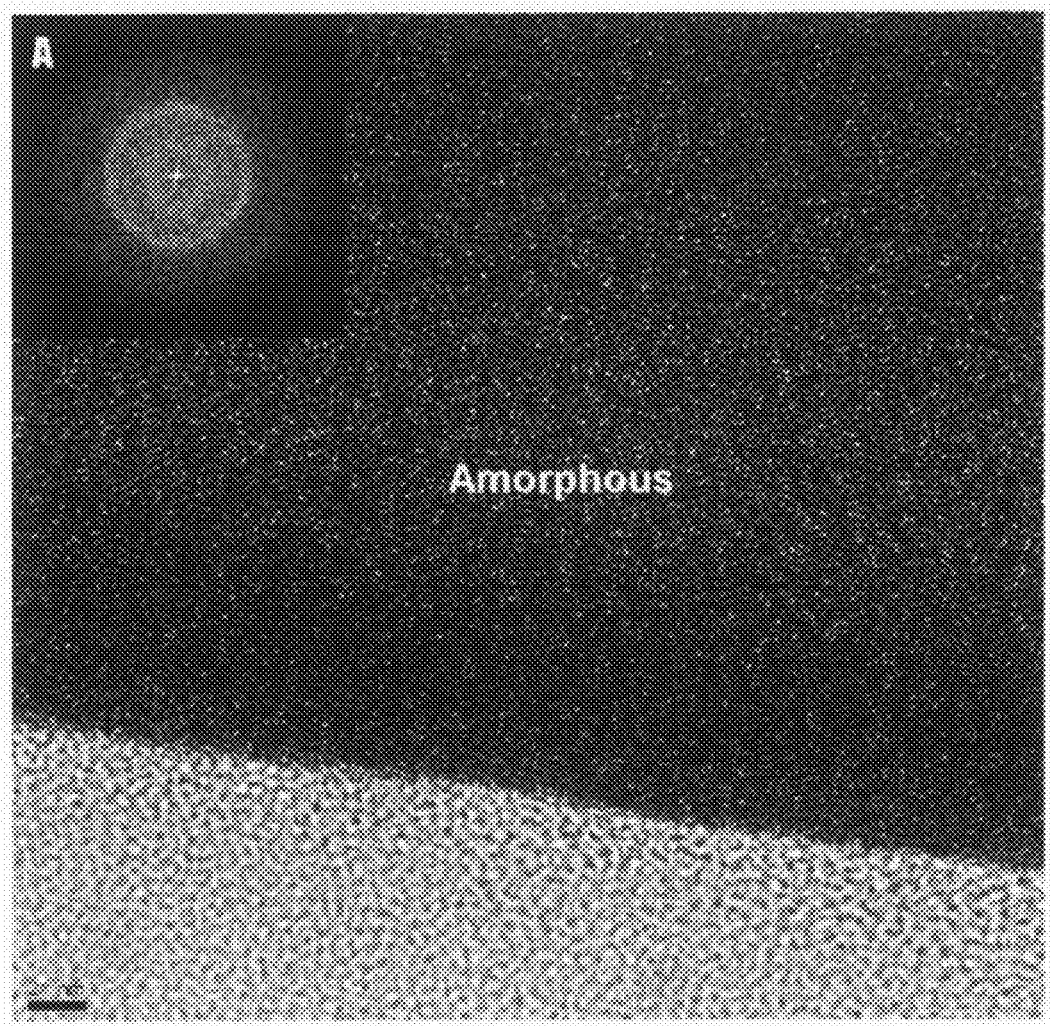
Figure 4C:
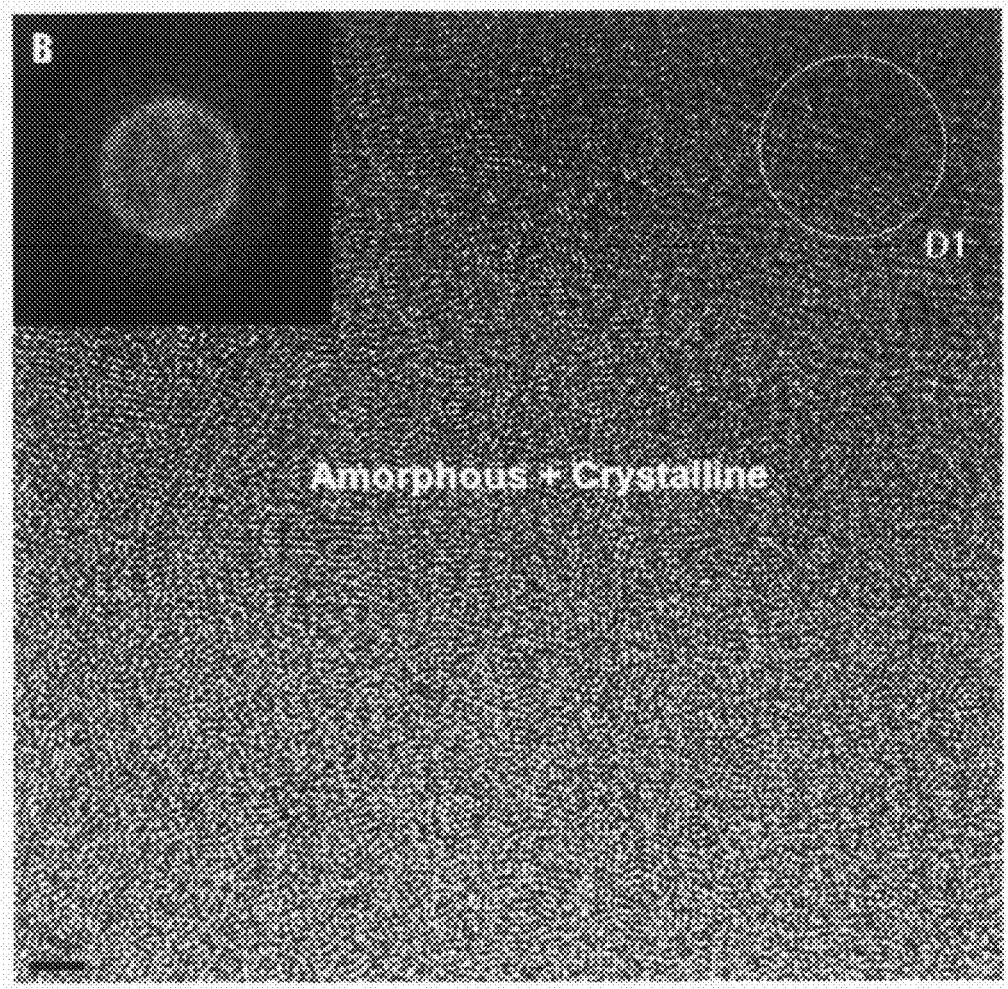
Figure 4D:
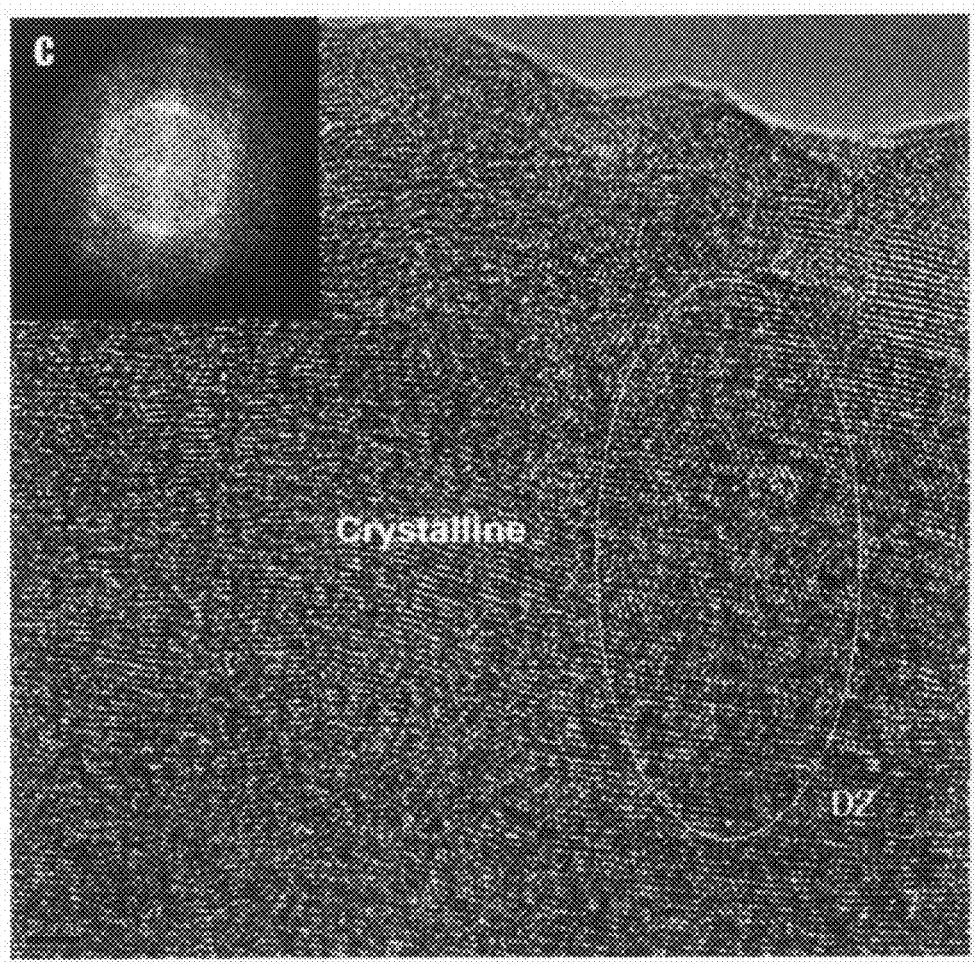

FIG. 4A illustrates TEM images of a section of an oxide semiconductor formed using a IZO (InZnO) material having Hf on a $SiO_2$ insulating layer. In this example, A is a boundary region between a $SiO_2$ insulating layer and an oxide semiconductor, B is an intermediate region of the oxide semiconductor, and C is the top region of the oxide semiconductor layer. TEM images and diffraction patterns of A to C regions are shown in FIGS. 4B to 4D. Although TEM images and diffraction patterns of samples thermally treated at about 150° C. were obtained, the crystalline phase of the samples was not changed according to the thermal treatment. In the samples which were not thermally treated and thermally treated at about 300° C., the same results were obtained.

As shown in FIG. 4B, region A is in an amorphous phase. A diffraction pattern image of the region A is shown at the left upper side of FIG. 4B indicating that region A has amorphous phase. Referring to the diffraction pattern, a faint circle is shown, which indicates that an amorphous phase is formed in the lower region of the oxide semiconductor.

As shown in FIG. 4C, the region B includes concurrent or co-existing amorphous and crystalline phases. The stripe D1 represents the nanocrystalline phase formed within the amorphous phase in region B. A diffraction pattern image of region B is shown at the left upper side of FIG. 4C. Referring to the diffraction pattern, a faint circle and dots are shown, which is indicative of the co-existence of amorphous and crystalline phases.

As shown in FIG. 4D, region C is in the crystalline phase. Stripes D2 having various orientations are formed throughout region C, which indicates that region C is in the crystalline phase. A diffraction pattern image of the C region is shown at the left upper side of FIG. 4D. Referring to the diffraction pattern, a faint circle and a plurality of dots are observed, which indicates that a crystalline phase having various orientations is formed in region C.

As a result, oxide semiconductors according to at least some example embodiments may have a structure including both an amorphous region and a crystalline phase having identical or substantially identical chemical compositions. The amorphous and crystalline phases may co-exist. For example, the amorphous phase may be formed in the lower region of the oxide semiconductor, both the amorphous phase and the crystalline phase may coexist in the intermediate region, and the amount of the crystalline phase may be increased in the upper region. The location of the amorphous phase may be identified and the thickness of the amorphous phase region of the oxide semiconductor may be in the range of about 10 to about 50 nm, inclusive, for example in the range of about 20 to about 30 nm, inclusive.

Figure 5A:
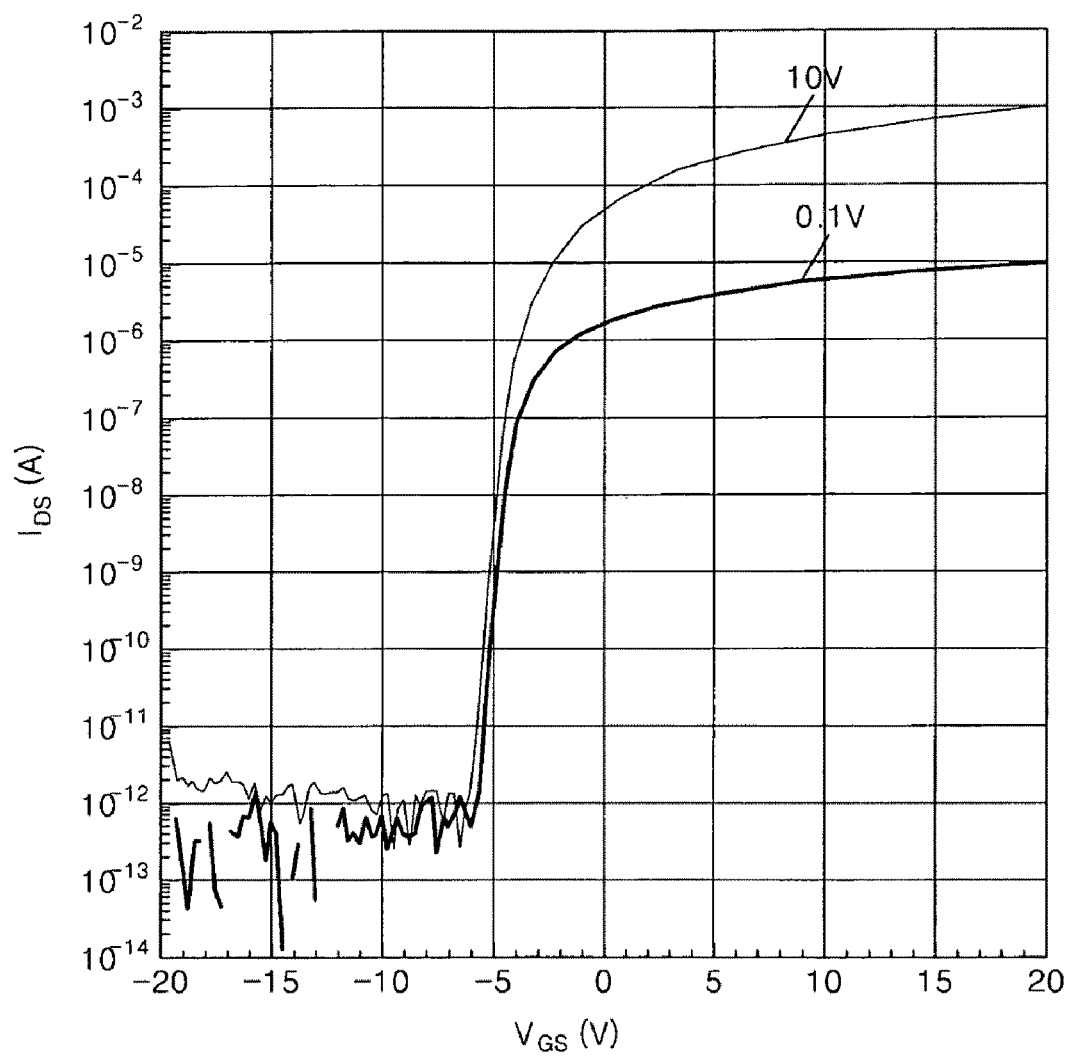
FIG. 5A is a graph illustrating changes in drain current according to gate voltages of an oxide thin film transistor according to example embodiments.

FIG. 5A is a graph illustrating performance test results of an oxide thin film transistor according to an example embodiment (e.g., channel size: W/L=50 μm/4 μm). In more detail, FIG. 5A is a graph illustrating changes in drain current ($I_{DS}$) according to gate voltages ($V_{GS}$) of an oxide thin film transistor according to an example embodiment when source-drain voltages of 0.1V and 10V are applied to the oxide thin film transistor. Referring to FIG. 5A, an On-current is in the range of about $10^{-3}$ to about $10^{-5}$ A, inclusive, an Off-current is about $10^{-12}$ A or less, and an On/Off current ratio is about $10^7$ or more.

Figure 5B:
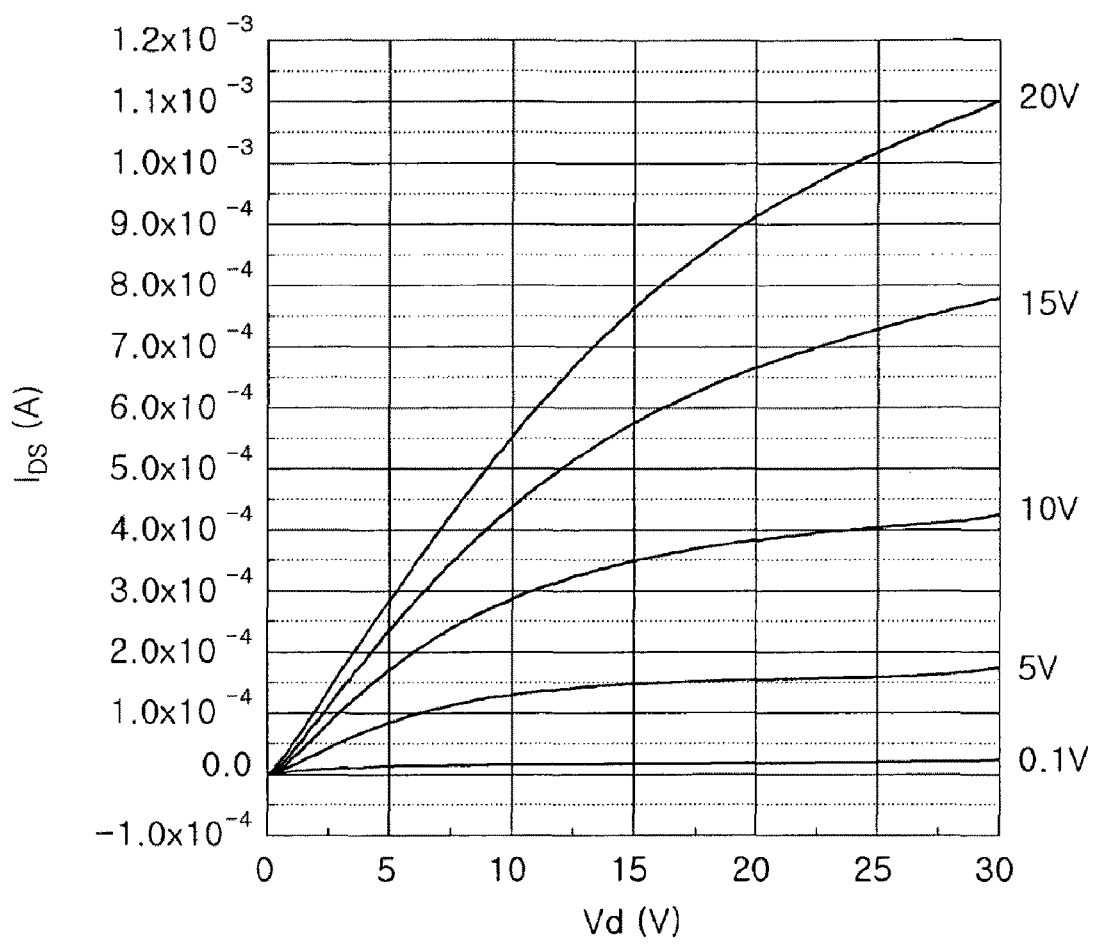
FIG. 5B is a graph illustrating changes in drain current ($I_{DS}$) of an oxide thin film transistor according to drain voltages ($V_d$) when various source-drain voltages (0.1 V, 5 V, 10 V, 15 V and 20 V) are applied to the oxide thin film transistor.

FIG. 5B is a graph illustrating changes in drain current ($I_{DS}$) according to drain voltages ($V_d$) of an oxide thin film transistor according to an example embodiment when source-drain voltages of 0.1 V, 5 V, 10 V, 15 V and 20 V are applied to the oxide thin film transistor.

Referring to FIG. 5B, when a source-drain voltage of 0.1 V is applied to the gate, the drain current may remain constant or substantially constant despite an increase in drain voltage. However, when the gate voltage is greater than or equal to 5 V, the drain current may increase as the drain voltage increases. A channel mobility calculated from FIGS. 5A and 5B may be about 20 cm$^2$/Vsec, and a gate swing voltage calculated from FIG. 5A may be about about 231 mV/dec.

Thus, oxide TFTs according to at least some example embodiments may exhibit a relatively high "On/Off" current ratio and a relatively low "Off" current, without hysteresis. As a result, oxide TFTs according to example embodiments may have improved oxide TFT characteristics.

An oxide thin film transistor according to at least some example embodiments may also be prepared by controlling the amount of Hf added to the InZn oxide. In this example, the oxide semiconductor thin film may be formed by adjusting the amount of Hf while the IZO target power is fixed at about 150 W. About 15 W, about 20 W, about 30 W and about 35 W may be applied to the Hf target to prepare Hf15, Hf20, Hf30 and Hf35, respectively.

In an experiment, gate voltage ($V_{GS}$)-drain current changes ($I_{DS}$) of the above-described oxide thin film transistor were measured. In order to evaluate composition of the oxide semiconductor materials, Inductively Coupled Plasma (ICP)-Auger Electron Spectroscopy (AES) analysis was performed. The analysis results of the compositions of Hf, In and Zn are shown in Table 1 below.

TABLE 1

| No. of sample | Hf (at % ratio) | In (at % ratio) | Zn (at % ratio) |
|---|---|---|---|
| Hf15 | 1 | 19 | 14 |
| Hf20 | 1 | 13.5 | 9.8 |
| Hf30 | 1 | 8.2 | 5.8 |
| Hf35 | 1 | 7 | 4.8 |

Error range: ±1%

As shown in Table 1, the amount of Hf added may increase as the current applied to the Hf target increases.

Figure 6:
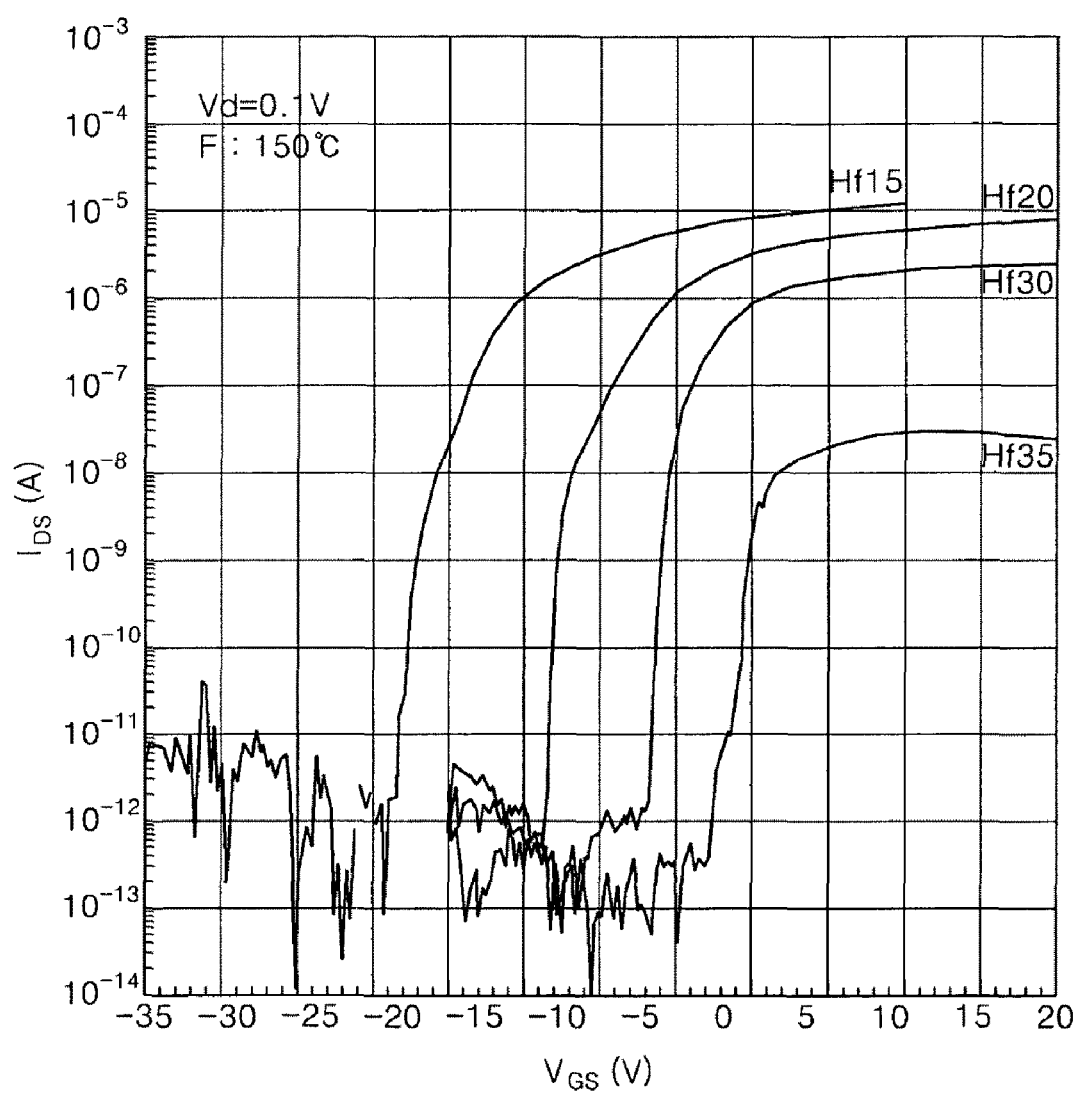
FIG. 6 is a graph illustrating changes in drain current ($I_{DS}$) of an oxide thin film transistor with respect to different compositions of Hf—In—Zn.

FIG. 6 is a graph illustrating changes in drain current ($I_{DS}$) according to gate voltages ($V_{GS}$) of an oxide thin film transistor according to an example embodiment (channel size: W/L=50 um/4 um) prepared by thermally treating the oxide thin film at about 200° C. Referring to FIG. 6, as the amount of Hf increases, On voltage (Von) may move to the right and values of On current (Ion) may decrease.

According to at least some example embodiments, the composition of the deposited thin film, $I_{DS}$-$V_{GS}$ graph, and mobility properties may vary according to the type of the target, voltage applied to the target, deposition equipment, deposition pressure, oxygen partial pressure, temperature of substrate, or the like. For example, when a HfInZnO single target is used instead of using both a InZnO target and a Hf target, the composition of the deposited thin film may change. Furthermore, even when the composition of the deposited thin film is the same or substantially the same, properties of the thin film may change. For example, when the oxide semiconductor is deposited using sputtering, the resistance range may change (e.g., largely) according to partial pressure of oxygen. If the partial pressure of oxygen is controlled to be less than a certain level, the deposited thin film may have a relatively low resistance. If the partial pressure of oxygen is controlled to be greater than a certain level, the deposited thin film may have a relatively high resistance.

Thus, in oxide semiconductors according to example embodiments, when an at % of Hf:In:Zn is in the range of about 0.5 to 10:1 to 20:0.5 to 40, the composition may be applied to a channel of a thin film transistor. In another example, the at % of Hf:In:Zn may be in the range of about 1:7 to 19:4.8 to 14. According to Table 1, when the at % of Hf:In:Zn is within the range of about 1:7 to 19:4.8 to 14, the oxide thin film transistor may have its desired properties.

It will be understood by those of ordinary skill in the art that an oxide semiconductor according to example embodiments may be applied to various electronic devices such as driving transistors of flat panel displays such as LCDs and OLEDs and transistors included in peripheral circuits of memory devices. The oxide thin film transistors according to example embodiments may be a bottom gate-type or top gate-type.

According to example embodiments, the ranges of values set forth herein are meant to be inclusive, whether or not explicitly indicated as such. Consequently, ranges of values designated as, for example, about 0.5 to 10 may include values equal or substantially equal to 0.5 and values equal or substantially equal to 10 in addition to the values between 0.5 and 10.

While the present invention has been particularly shown and described with reference to example embodiments thereof, it will be understood by those of ordinary skill in the art that various changes in form and details may be made therein without departing from the spirit and scope of the present invention as defined by the following claims.

What is claimed is:

1. An oxide semiconductor layer comprising Zn and Hf, wherein the oxide semiconductor layer is an amorphous oxide semiconductor channel region.

2. The oxide semiconductor layer of claim 1, wherein the Zn is a Zn oxide to which Hf is added.

3. The oxide semiconductor layer of claim 1, wherein the Zn is a Zn—In composite oxide to which Hf is added.

4. The oxide semiconductor layer of claim 3, wherein an at % ratio of Hf:In:Zn is in the range of about 0.5 to 10:1 to 20:0.5 to 40, inclusive.

5. The oxide semiconductor layer of claim 3, wherein an at % ratio of Hf:In:Zn is in the range of about 1:9 to 19:4.8 to 14, inclusive.

6. The oxide semiconductor layer of claim 1, wherein a structure of the oxide semiconductor layer includes an amorphous phase region and crystalline phase region.

7. The oxide semiconductor layer of claim 6, wherein a structure of the oxide semiconductor layer includes an amorphous phase region, a mixed region of amorphous and crystalline phases and a crystalline phase region.

8. The oxide semiconductor layer of claim 7, wherein a thickness of the amorphous phase region is in the range of about 10 nm to about 50 nm, inclusive.

9. The oxide semiconductor layer of claim 7, wherein a thickness of the amorphous phase region is in the range of about 20 nm to about 30 nm, inclusive.

10. The oxide semiconductor layer of claim 1, further comprising: at least one selected from the group consisting of elements of Groups I, II, III and IV and elements belonging to the lanthanide series.

11. The semiconductor oxide of claim 1, wherein the Zn is one of a Zn oxide and an InZn composite oxide, and the Hf is ionically bonded to oxygen of the Zn oxide or InZn composite oxide.

12. An oxide thin film transistor comprising:
   a gate; a channel formed to correspond to the gate, the channel comprising an oxide semiconductor comprising Zn and Hf, wherein the oxide semiconductor is an amorphous oxide semiconductor; a gate insulating layer formed between the gate and the channel; and a source and drain contacting respective sides of the channel.

13. The oxide thin film transistor of claim 12, wherein the oxide semiconductor includes a Zn oxide to which Hf is added.

14. The oxide thin film transistor of claim 12, wherein the oxide semiconductor includes a Zn—In composite oxide to which Hf is added.

15. The oxide thin film transistor of claim 14, wherein the channel has an at % ratio of Hf:In:Zn in the range of about 0.5 to 10:1 to 20:0.5 to 40, inclusive.

16. The oxide thin film transistor of claim 14, wherein the oxide semiconductor has an at % ratio of Hf:In:Zn in the range of about 1:7 to 19:4.8 to 14, inclusive.

17. The oxide thin film transistor of claim 12, wherein the channel has a structure including an amorphous phase region and crystalline phase region.

18. The oxide thin film transistor of claim 17, wherein a thickness of the amorphous phase region is in the range of about 10 to about 50 nm, inclusive.

19. The oxide thin film transistor of claim 17, wherein a thickness of the amorphous phase region is in the range of about 20 to about 30 nm, inclusive.

20. The oxide thin film transistor of claim 12, wherein the channel includes an amorphous phase region, a mixed region of amorphous and crystalline phases and a crystalline phase region.

21. The oxide thin film transistor of claim 12, wherein the channel further includes,
   at least one selected from the group consisting of elements of Groups I, II, III and IV and elements belonging to the lanthanide series.

22. The oxide thin film transistor of claim 12, wherein the Zn is one of a Zn oxide and an InZn composite oxide, and the Hf is ionically bonded to oxygen of the Zn oxide or InZn composite oxide.

23. A display comprising:
   the oxide thin film transistor according claim 12 as at least one of a driving and switching transistor.

* * * * *